US005754666A

United States Patent [19]

Nakagawa

[11] Patent Number: 5,754,666

[45] Date of Patent: May 19, 1998

[54] METHOD FOR REPRODUCING AUDIO SIGNALS AND AN APPARATUS THEREFORE

[75] Inventor: Shin Nakagawa, Kiyose, Japan

[73] Assignee: Fidelix Y.K., Tokyo, Japan

[21] Appl. No.: 536,116

[22] Filed: Sep. 29, 1995

[30] Foreign Application Priority Data

| | | | |
|---|---|---|---|
| Oct. 6, 1994 | [JP] | Japan | 6-268268 |
| May 12, 1995 | [JP] | Japan | 7-138435 |
| May 12, 1995 | [JP] | Japan | 7-138436 |

[51] Int. Cl.$^6$ ..... H03G 5/00

[52] U.S. Cl. ..... 381/98; 381/61

[58] Field of Search ..... 381/98, 61, 58, 381/59, 103

[56] References Cited

U.S. PATENT DOCUMENTS

| | | | |
|---|---|---|---|
| 5,233,665 | 8/1993 | Vaughn et al. | 381/98 |
| 5,267,095 | 11/1993 | Hasegawa et al. | |
| 5,388,159 | 2/1995 | Sakata | 381/98 |
| 5,444,784 | 8/1995 | Toyama | 381/61 |
| 5,530,769 | 6/1996 | Saitoh | 381/98 |
| 5,574,791 | 11/1996 | Orban | 381/98 |

FOREIGN PATENT DOCUMENTS

| | | |
|---|---|---|
| 2-68773 | 3/1990 | Japan . |
| 4-321959 | 11/1992 | Japan . |

*Primary Examiner*—Wing F. Chan
*Assistant Examiner*—Vivian Chang
*Attorney, Agent, or Firm*—Birch, Stewart, Kolasch, Birch, LLP

[57] ABSTRACT

When reproducing an audio signal with a conventional audio signal reproducing system, an unnaturalness in the quality of the reproduced sound occurs. The unnaturalness is caused by the frequency spectrum of the reproduced sound which is decreased or cut off at an upper limit of a reproducible frequency range or at an upper limit of an audible frequency range. The present invention adds a random noise component and/or a higher harmonics component exceeding over the upper limit of the reproducible frequency range or the upper limit of the audible frequency range to the original audio signal. By so doing, the reproduced sound has an excellent audio quality which can be sensed by the listener.

26 Claims, 11 Drawing Sheets

METHOD FOR REPRODUCING AUDIO SIGNALS AND AN APPARATUS THEREFORE

BACKGROUND OF THE INVENTION

The present invention relates to a method for reproducing audio signals and an apparatus therefore, which is suitably used in all forms of audio signal reproducing systems. The invention particularly relates to a method for reproducing audio signals and an apparatus therefore by which the quality of the reproduced sound is favorably improved to become natural in a higher compass range of sound.

RELATED ART

There are developed many types of audio signal reproducing systems, whose sound sources are recorded on media, such as compact cassette tapes and records, by using an analog audio signal recording technique, or on other media, such as compact discs, compact miniature discs, digital compact cassette tapes, digital audio tapes and laser discs, by using a digital audio signal recording technique. Further, another type of audio signal reproducing system, whose sound source is taken from electronic waves such as FM broadcasting, BS and CS, is also developed. These audio signals are generally reproduced with the aid of electronic-audio signal conversion elements, such as speakers and earphones, after the signals are amplified by suitable amplifiers. Furthermore, in electronic music instruments, sound information is inputted thereto by a sound signal inputting means, such as a keyboard, and then altered to digital signals and reproduced with the aid of electronic-audio signal converting elements after amplification.

A major task in such audio signal reproducing techniques is how to reproduce the audio signals to be as natural as the original sound. It has been considered that the range of frequency audible for ordinary people is from about 20 Hz to 20 kHz. Thus, in conventional audio signal reproducing apparatuses, the frequency characteristics of audio signals is normalized so as to satisfy the range, therefore the apparatuses are so designed as to reproduce the signals normalized in such manner. In conventional analog audio signal reproducing systems, if it is attempted to enlarge the reproducible frequency range of the system in order to reproduce the sound as natural as the original sound, some difficulties would be caused in designing the amplifiers or electronic-audio signal conversion elements of the system, the cost therefore would become expensive. In addition, the frequency range of the reproducible signal of the system is further limited by other factors, for example, the characteristics of the audio signal recording media, such as music tapes, or an assignment of a frequency band of broadcasting electronic waves.

On the other hand, the digital audio signal reproducing system, which is the main current of the recent audio signal reproducing technique, has such a merit that the audio signals can be recorded and reproduced much more natural compared to the original sound, because audio information is not damaged even if the media are used repeatedly and the audio information is not deteriorated in its lines.

In the beginning when the digital audio signal reproducing systems went on markets, people believed that the digital audio signal reproducing systems were normalized so as to be able to reproduce the whole frequency range audible for ordinary people and the systems cover the dynamic range of the original music sound sufficiently. Thus, the apparatuses are still now sold in the markets with announcements that people can get sound quality the same as that in a music studio. Therefore, people consider the naturalness of music sound reproduced by the digital audio signal reproducing system as satisfying a significant high level.

However, when audio signals are recorded in the digital system, the frequency range and the dynamic range of the reproduced music sound are limited by a sampling frequency of the system or bit numbers when the signals are changed to digital signals. Therefore, in the digital audio signal reproducing system, some information is compelled to be cut off from the original audio information when the signal is changed to digital one. This is a coherent point which is different from the analog recording/reproducing technique, in which the original sound information is still retained in the reproduced sound nevertheless the original information is affected by noises and/or some distortion is generated in the reproduced sound.

In any case, the lack of audio signals in the digital recording/reproducing system, which comes from the inherent feature of the digital system, causes dissatisfaction for people wishing to reproduce the audio signals as natural as the original sound. By studies thereafter, it is shown that if the resolution of signals is improved in a low level or the signals can be recorded up to a higher frequency range, the sound quality reproduced in the audio signal reproducing systems may be improved. Additionally, it is attempted to record information with a higher bit or a higher sampling frequency. Furthermore, it begins to be considered to use a new format of 1.96 MHz per one bit, by which signal transmission speed becomes higher and the linearity of signals in a lower level is improved in principle. In any event, the sound quality in the digital audio system is still unsatisfactory to the auditory senses of people. In addition, the digital audio system also has the above-stated problem namely the analog audio system in a step after D/A conversion.

As a background to the recognition that the current audio signal reproducing apparatuses are unsatisfactory for the auditory sense of people, it is recently said that auditory tissues of people react not only to audio signals in the audible frequency range but also to audio signals in a higher range than the audible frequency range, i.e. up to about 90 kHz. That is to say, it is considered that people can feel sounds in the higher range exceeding over an upper limit of the audible frequency range, i.e. 20 kHz.

In the digital audio signal reproducing system, the frequency characteristics in a higher range is limited by a sampling frequency thereof. For instance, the sampling frequency of a CD player is 44.1 kHz; and the higher limit of the reproducible frequency thereof is 1/2.2 of the sampling frequency, i.e. 20 kHz. Therefore, in the frequency spectrum of the audio signal reproduced in the system, the higher region exceeding over 20 kHz is cut off. Since people can feel the sound exceeding over 20 kHz as stated in above, it is impossible to satisfy the auditory sense of people with the signal without the higher region.

FIG. 1 is a graph showing a reproducing condition of an audio signal recorded on a compact disc. In FIG. 1(*a*), a frequency spectrum of a natural music sound is shown, in which a frequency compound higher than 20 kHz is included. FIG. 1(*b*) on the contrary shows a frequency spectrum of a reproduced music signal of sound recorded on a compact disc, in which the frequency characteristic is sharply dropped at a point of 20 kHz. In other words, the reproduced music signal shown in FIG. 1(*b*) has substantially no spectrum exceeding over 20 kHz. However, it is impossible or very difficult to restore the cut-off music information, nevertheless it is predicted that if the music information is reproduced without cutting off the signal component higher than 20 kHz a much more favorable sound quality could be obtained.

While, in the analog audio reproducing system, the higher region is not cut-off, but the signal reproducing characteristic in the range higher than 20 kHz, i.e. the upper limit of the audible frequency, is suddenly decreased, so that the sound cannot be substantially reproduced in the higher range. Therefore, in order to obtain reproduced signals satisfying the auditory sense of people, it is also necessary to compensate for the range higher than 20 kHz as well as for the digital audio signal reproducing system.

In Japanese Patent Preliminarily Laid-Open Publication Ho. Hei2-68773, a means for adding audio signals having a frequency component exceeding over the cut-off frequency of the digital signal reproducing system is disclosed under the title of Audio Signal Reproducing Apparatus.

In this conventional apparatus, it is arranged such that an energy component is added to an original audio signal on the basis of the knowledge that people cannot recognize the signals in the higher frequency range exceeding over the upper limit of the audible frequency as a music sound but are influenced by the energy component of the sound in the higher frequency range. In the above-mentioned Publication, it is taught that a signal, such as a noise, which can be easily obtained as a signal component, is added to an original audio signal.

The publication suggests that it is not necessary to add the signal component in the higher range of the original sound as it is, but some effect can be obtained by adding a noise signal having almost the same frequency range and spectrum as those of the cut-off signal in the digital system or a noise signal having almost the same frequency range as the decreased frequency range in the analog system to the original signal.

However, as explained in the above, it is said the auditory sense tissues of people act to a sound in the higher frequency range up to about 90 kHz. And then the present inventor discovered that there causes auditory differences when hearing the reproduced sound, depending upon the spectrum of signal component in the higher range of the signal to be added to the original audio signal or how to add the signal to the original audio signal. That is to say, the type of the noise signal to be added to the original audio signal or the way to add the noise signal gives a great influence to the quality of the reproduced music sound.

Further, it is considered that in order to obtain a natural quality of the reproduced sound it is necessary to add the noise component which closely corresponds to an original audio information in the audible frequency range.

Furthermore, considering a reproduced sound of every sort of music instrument, the sound thereof comprises not only a base sound of the music instrument but also higher harmonics thereof so that an inherent sound quality of the music instrument is made up from a distribution of the higher harmonics components, and the higher harmonics include a frequency component exceeding over the audible frequency range. Moreover, the frequency components exceeding over the audible frequency range are also included in the sounds which are generated by beating, rubbing, or blowing or the similar sounds when the instruments are played. Therefore, even if only the higher harmonics are merely added to the original signals, there still remains a fear that a quality of the reproduced sound in the higher range cannot be balanced, because the distribution of the higher harmonics is different from each other depending upon the type of the music instrument.

The present invention has for its object to provide an audio signal reproducing method and apparatus therefore by which the quality of sound reproduced in the audio signal reproducing system, particularly the quality of the sound in the higher frequency range is improved and thus the reproduced audio signals thereby give a comfortable sound to people's ears. In the present invention, in order to compensate for the unnaturalness caused by that the spectrum of the frequency characteristics is decreased (analog audio system) or the spectrum is cut off (digital audio system) in the higher range, a similar signal component to the decreased or cut-off spectrum is added to an original audio signal.

SUMMARY OF THE INVENTION

The present invention has a first aspect that a noise component having a spectrum similar to the spectrum in the higher range of an original audio signal, which is decreased or cut-off when the audio signal is reproduced, is added to the original audio signal; and thus an excellent sound quality can be obtained by selecting the type of noises to be added and processing the selected noise.

That is to say, according to the first aspect of the invention, a random noise component or a noise component similar to the random noise is selected as a signal to be added to the original audio signal, on the basis of the analysis by the present inventor that most of the signal component in a higher frequency range of the original music sound generated from the factors of beating, rubbing or blowing, and the characteristics of such sound is very close to that of random noise.

In the present invention, the signal to be added to the original audio signal is not specified but all kinds of signals including frequency components in the higher range in a random manner may be used. However, in general, a noise is the easiest signal to obtain. Thus, in the present invention, a noise generator or a noise generating circuit is used as a signal source for generating random noise to be added to the original audio signal; and a signal component having a higher frequency range exceeding over the higher limit of the reproducible frequency range or over the higher limit of the audible frequency range is selected from the output of the signal source with the aid of a filtering means; and then the selected output is added to the original audio signal. It should be noted that in this specification the term "random" does not require that the frequency is distributed in a serious random manner, but every kind of suspected random noise signal, which is artificially generated, can be used.

In this specification, the term "audible frequency region" means a frequency range which is audible for people, and the value therefore is between about 16 Hz to 20 kHz, which is measured by sign waves. The upper limit of the audible frequency range of people measured by sign waves is about 20 kHz. However, as explained in above, it is said that people can physically feel a very high frequency in a spectrum of a music signal up to about 90 kHz. The present inventor has recognized this by experiments.

The present invention has a second aspect that when an original audio signal is reproduced, a higher harmonics component of the original audio signal exceeding over an upper limit of a reproducible frequency range of the original audio signal or over an upper limit of an audible frequency range and a noise component having a frequency spectrum exceeding over the upper limit of the reproducible frequency range of the original audio signal or over the upper limit of the audible frequency range are added to the original audio signal. According to the second aspect of the invention, the noise component to be added to the original audio signal is also selected from the noise generator with the aid of a filtering means so as to have a frequency spectrum exceeding over the upper limit of the reproducible frequency range or the upper limit of the audible frequency range; and the term "random" means that every kind of suspected random signals can be used, as well as the first aspect.

According to the second aspect of the invention, both higher harmonics components of the original audio signal and the random noise components obtained from the signal source, which are provided being separated from the signal supply of the original audio signal, are added to the original audio signals in order to compensate for the signal components, which has been cut off (distal reproducing apparatus) or decreased (analog reproducing apparatus), from the original audio signals. Thereby, the above mentioned problems generated in the conventional audio signal reproducing apparatuses can be solved and much more qualified reproduced sound can be obtained, and thus a much more natural reproduction sound can be obtained.

In a third aspect of the present invention, it is arranged that the level of the noise component to be added to the original audio signal is controlled in a dynamic manner in response to a level of an output in a specific frequency range of the original audio signal.

As shown in FIG. 1(*a*), the spectrum of the original audio signal is continued over the whole range. In other words, the higher side of the spectrum in the audible frequency region continues to the other region exceeding over the higher limit. The third aspect is based on the thinking that a natural reproduced sound can be obtained by controlling the level of the noise component to be added to the original audio signal in accordance with the variation of the level of the output in the higher frequency range selected from the original audio signal in a dynamic manner.

It is preferred to select a frequency range around 20 kHz, i.e. between *6* to 20 kHz, which is the lower limit of the noise signal to be added to the original audio signal, from the original audio signal as the higher frequency range to be selected from the original audio signal, taking the continuity of the spectrum into consideration. However, in case of an analog audio system, in which the signal in the frequency range exceeding over 20 kHz is also outputted, it is not necessary to cut off the higher frequency range to be selected from the original audio signal at 20 kHz. Therefore, in an analog audio system it may be possible to arrange such that the noise component is added to the original audio signal in response to an output of a high pass filter through which the original signals having a frequency of 6 kHz or more may pass.

Further, the dynamics of the noise component to be added to the original audio signal may be arranged such that the noise components are added thereto merely as to be in proportion to the output of the original audio signals in a specific frequency range, or, added thereto with a specific non-linearity. The arrangement can be determined in accordance with the signal reproducing characteristics of the audio system to be used or hearing tests of the system.

Furthermore, the present invention has another aspect that a part of the output of the original audio signal in the given higher range is delayed by a predetermined time, and the delayed output is used as a level control signal for controlling the output level of the noise component (or the noise component and the higher harmonics component) to be added to the original audio signals.

This aspect is based on the present inventor's discovery that the time delay generated in the level controlling signal, i.e. an output level of the given frequency range of the original audio signal used for controlling the level of the noise component to be added to the original audio signal, gives a great influence to the sound quality of the reproduced audio signals; and an excellent sound quality can be obtained by the time delay thereof. More concretely, by repeated hearing tests, it is recognized that when the level of the noise component to be added to the original audio signals is controlled in accordance with the level controlling signal which has passed through a time constant circuit having a time constant within a specific range, the reproduced sound satisfies people's audio sense in an excellent manner. If the time constant becomes shorter exceeding over the lower limit of the specific range, the quality of the reproduced music sound becomes noisy; in contrast to this, the time constant becomes longer exceeding over the upper limit of the range, the sound becomes to have a viscosity. The preferred range of the time constant is about 2.2 mS, more preferably 2.2 mS plus or minus 40%.

Moreover, it is preferred to use a thermal noise as a signal source of the random noise to be added to the original audio signal.

In order to generate a random noise, a Zener diode is usually used, because the noise level obtained from the Zener diode is high and only a small number of amplifying steps is required. However, as a result of hearing tests, it is found out that the sound reproduced with the addition of the random noise generated from the thermal noise has finer definition in comparison with the sound reproduced with the addition of the random noise generated from the Zener diode, while both the noises have the same spectrum.

The reason is considered as follows. The source of noise is electrons in both the cases of the Zener diode or the thermal noise. However, in the Zener diode, the noise is obtained by a collective avalanche phenomenon of electrons caused by the avalanche effect, so that the definition of the reproduced sound becomes rough. In contrast thereto, in case of the random noise obtained from the thermal noise, the noise is generated by a fluctuation caused by a thermal motion of electrons in a resistance element. In this case, therefore, the noise is generated in a uniformed and random manner, so that the definition of the reproduced sound becomes fine and smooth. It should be noted that it may be possible to use the thermal noise obtained from a base resistance of transistors or from a channel resistance of FETs as the noise source.

Moreover, it is much preferred that a pink noise or the similar noise to the pink noise is added to the original audio signal. Since such a pink noise is not generated naturally, it is necessary to artificially generate it by decreasing the higher component of the thermal noise (white noise), which is used as a signal source of the noise component to be added to the original audio signal, little by little. Comparing the case where a white noise, from which an audible frequency range is merely cut off, is added to the original audio signals with the other case that a pink noise is added to the original audio signal by hearing tests, the reproduced sound in the former case becomes thin and sharp but in the latter case the reproduced sound becomes more natural. The reason why is considered because that the white noise has a flat frequency characteristics but in the pink noise the level is slowly down as the frequency becomes higher, which is much closer to the characteristic of the original sound.

It is preferred that the noise component to be added to the original audio signal does not include a component in the audible frequency range, i.e. a range of 20 kHz or less, as much as possible. In the preferred embodiments of the present invention, the noise component in the range of 20 kHz or less is positively cut off by using highly ordered filters, through which only the noise component exceeding over the upper limit of the audible or reproducible frequency range is passed. As a result of hearing tests, it is proved that as the order of the filters is higher, the noise becomes lesser in the reproduced audio signals, so that a clear reproduction sound signal can be obtained.

Furthermore, it is preferred that the source of the noise component to be added to the original audio signal is provided in each signal reproducing channel of the audio system in an independent manner.

In audio systems, are generally provided two channels for stereo systems, or multi channels for a special system, such as a surrounding system. In order to simplify the circuit construction, it is recommended that the random noises to be added to all of the channels are obtained from a single source and then the noises are distributed to each channel. However, as a result of comparing hearing tests, it is recognized that the reproduced sound expands naturally and a real presence can be obtained in the system where the random noise source is independently provided in each channel.

In the frequency range exceeding over 20 kHz of natural sounds, since the phase thereof is confused by an acoustic reflection, and thus the relationship of the phase of each channel is apt to disappear. Therefore, it is considered that if the noise source is independently provided in each channel, the reproduced sound becomes much closer to a natural sound.

Moreover, in the other preferred embodiment of the present invention, the signal (the random noise component or a higher harmonics component of the original audio signal and the random noise component) is added to the original audio signal via a capacitor.

When the random noise component or a mixture of the higher harmonics component of the original audio signal and the random noise component is added to the original audio signal via a capacitor, the signal to be added to the original audio signal is separated from the circuit for reproducing the original audio signal under the circumstance of a direct current, so that it is reduced that the output of the signal to be added to the original audio signal applies a load on a buffer amplifier in the original audio signal reproducing circuit. As a result, an auditory pressure in the middle and lower frequency range can be decreased. Any type of capacitor can be used unless it has an impedance which does not substantially prevent that the signal exceeding over 20 kHz passes through it.

The function of the present invention is as follows.

According to the first aspect of the present invention, an unnaturalness of sound quality of the reproduced audio signal caused by the lack of frequency characteristic in a higher range exceeding over the audible frequency area in the analog audio system, where the reproduced output is extremely decreased, or in a higher range exceeding over an upper limit of the reproducible frequency in the digital system, which is determined by a sampling frequency thereof, is compensated for by adding a noise component having a similar spectrum of the original sound. By the addition of the noise component, which is obtained from a signal source provided being separated from the original audio signal reproducing circuit, the spectrum of the reproduced signal becomes to be similar to the original sound, so that a naturalness in the auditory sense can be reproduced in the sound.

FIG. 2 is a schematic view showing a spectrum of an audio signal reproduced in the audio signal reproducing method according to the present invention. A primary audio signal of music sound has a frequency component covering both the regions A and B in FIG. 2, and it varies within the hatched portion of FIG. 2 in accordance with the dynamics of the original sound. However, in a sound reproduced in a digital audio system, such as a CD player, the higher range exceeding over 20 kHz is cut off and the reproduced audio signal has a spectrum covering only the region A of FIG. 2. While, in an analog audio system, the reproduced output thereof is decreased in the range exceeding over 20 kHz, which is an upper limit of audible frequency.

In the present invention, an audio signal having a spectrum corresponding to the region B in FIG. 2 is produced being independent from the original audio signal, by filtering the output of a noise generator, and then the thus produced signal corresponding to the region B is added to the original audio signal. Therefore, the reproduced signal having a spectrum similar to that of the original sound, can be obtained, so that the sound quality of the reproduced signal is improved.

Further, according to the second aspect of the invention, an unnaturalness of sound quality of the reproduction signal is compensated for by adding a higher harmonics included in the original reproducing audio signal and a noise component in a range exceeding over the audible frequency (or reproducible frequency), which is obtained from a signal source independently provided from the original audio signal reproducing circuit, to the original audio signal. As a result, the reproduced audio signal having a frequency spectrum much more similar to the original sound can be obtained. According to the second aspect of the present invention, it is possible to make the spectrum of the reproduction audio signal much more similar to the spectrum of the original sound and thus a natural sound quality in the auditory senses of people can be obtained, in comparison with a case that only a higher harmonics component or only a noise component is added to the original audio signal.

Furthermore, in the present invention, it is arranged that the level of the signal to be added to the original audio signal is varied so as to correspond to the dynamics of the output of the original audio signal in the range of, for example, 6 to 20 kHz, so that a sound much more similar to the original one can be reproduced.

BRIEF EXPLANATION DRAWINGS

FIGS. 1(*a*) and 1(*b*) are graphs showing spectrums of frequency components of audio signals; and FIG. 1(*a*) is a graph showing a spectrum of frequency component of an original audio signal, and FIG. 1(*b*) is a graph showing a spectrum of frequency component of a reproduced audio signal in a digital audio equipment:

DETAILED EXPLANATION OF THE PREFERRED EMBODIMENTS

Figure 1A:
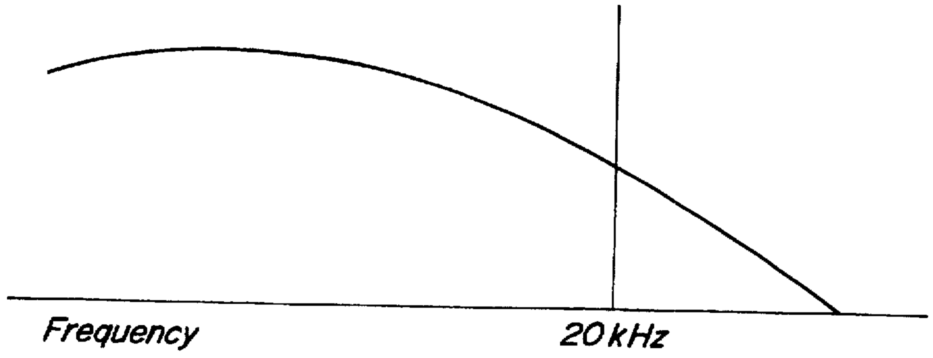
Figure 1B:
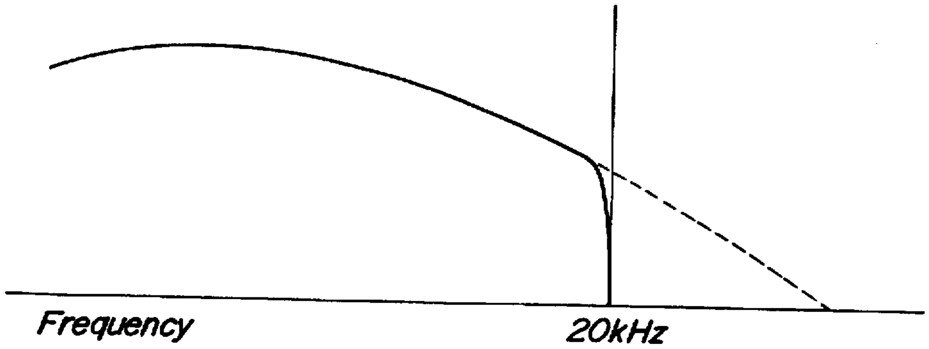
Figure 2:
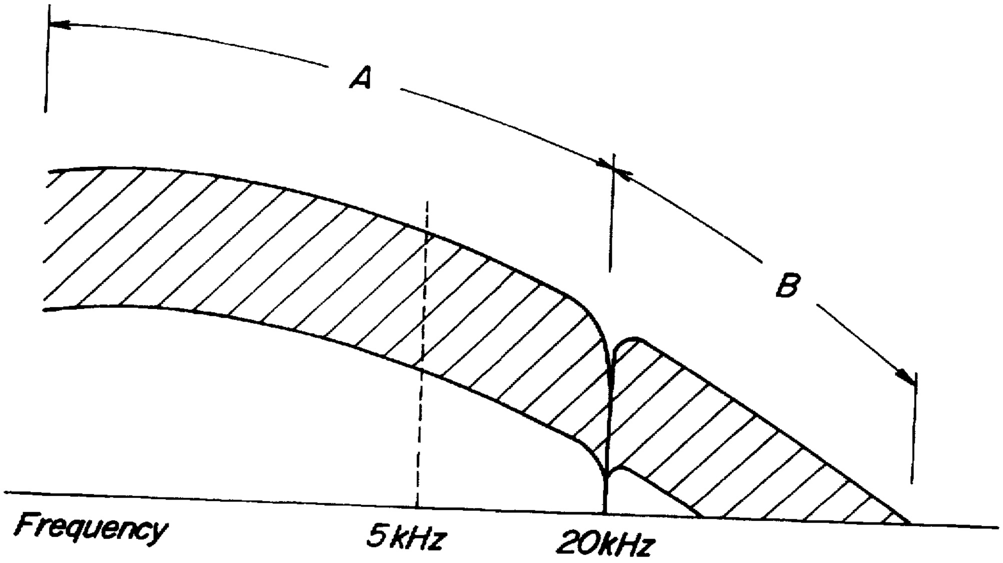
FIG. 2 is a graph depicting a spectrum of frequency of an audio signal for explaining a principle of the audio signal reproducing method according to the present invention.

Preferred embodiments according to the present invention will be explained, referring to the drawings.

Figure 3:
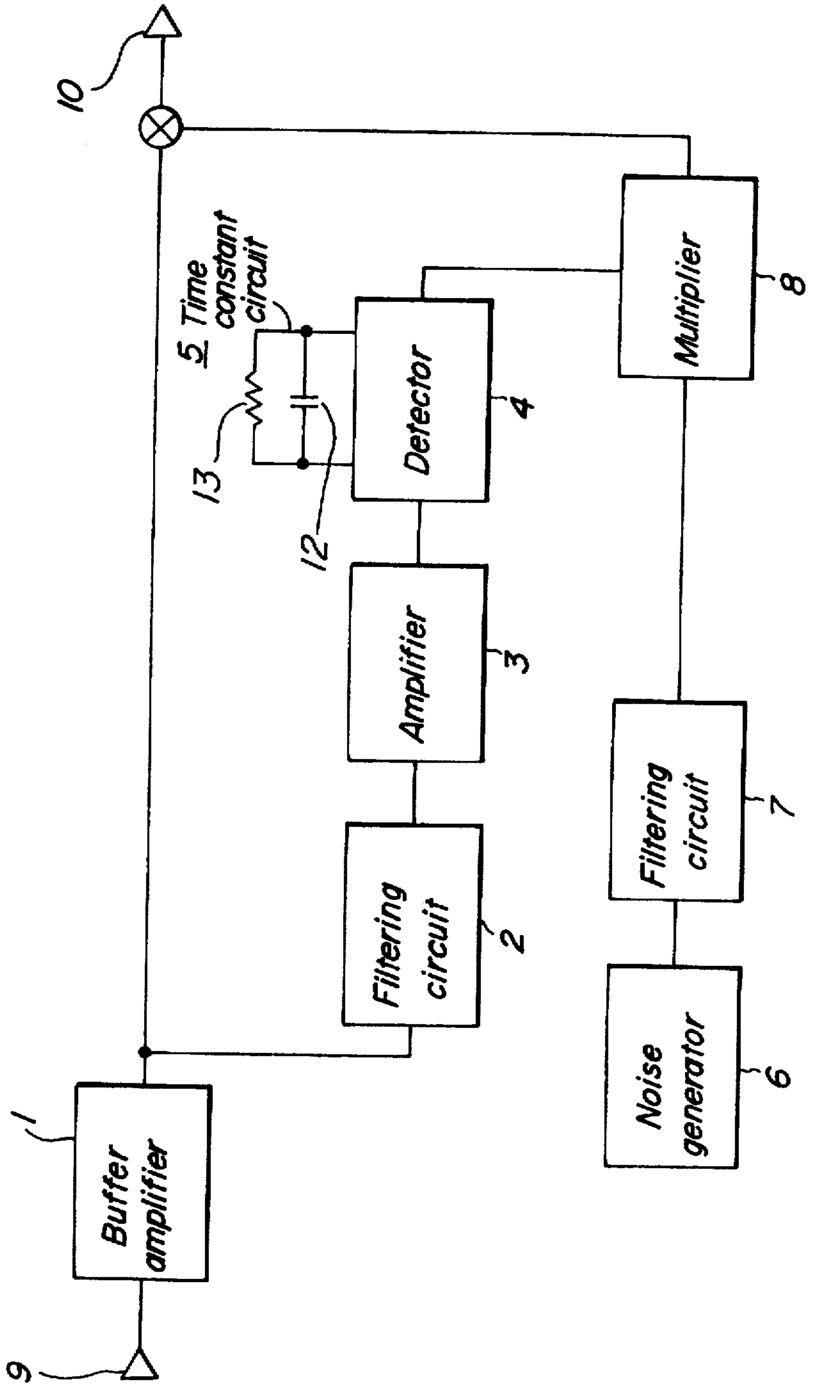
FIG. 3 is a block diagram illustrating a construction of the first embodiment of the audio signal reproducing apparatus according to the present invention.

FIG. 3 is a block diagram showing a construction of the first embodiment of the audio signal reproducing apparatus according to the present invention.

In FIG. 3, the apparatus according to the present invention is applied to an output circuit in an analog audio reproducing apparatus, or an output circuit after D/A conversion in the digital audio signal reproducing apparatus. An original audio signal is sent to a buffer amplifier 1 from an input terminal 9. One of the output signal of the amplifier 1 is directly sent to an output terminal 10, while the other one is inputted to a band pass filter 2. It should be noted that the band pass filter 2 can be replaced by a high pass filter. A specific frequency range of the audio signal passes through via the filter 2, and then the signal is amplified by an amplifier 3 up to a suitable level. Thereafter, the signal is detected by a detector circuit 4. The detected signal is then inputted into a multiplier circuit 8 via a time constant circuit 5 to generate a level control signal which is used for controlling the level of a noise component to be added to the original audio signal.

On the other hand, the noise component to be added to the original audio signal is obtained from a random noise generator 6. An output of the noise generator 6 is sent to a band pass filter circuit 7 to pass a frequency range thereof exceeding 20 kHz. It should be noted that the band pass filter circuit 7 can be replaced by a high pass filter. The output of the band pass filter 7 is inputted to a multiplying circuit 8 to multiply it with the output to said level control signal; and then the thus multiplied signal is added to the original audio signal. As a result, the output of the random noise generator 6 is added to the original audio signal in proportion to the output level of the original audio signal in the higher range, and then an audio signal to be reproduced is outputted from the output terminal 10. The frequency characteristic of the signal to be added to the original audio signal has no upper limit. However, if a noise component having a non-limited higher component is added, there is a fear to cause some other troubles. Therefore, it is preferred that the signal covers the higher frequency range up to about 100 kHz. The audio signal, to which the noise component has been added, is outputted from the output terminal 10 and then supplied to an electronic-audio converting elements, such as speaker, earphone, etc. (not shown), via suitable amplifiers.

Figure 4:
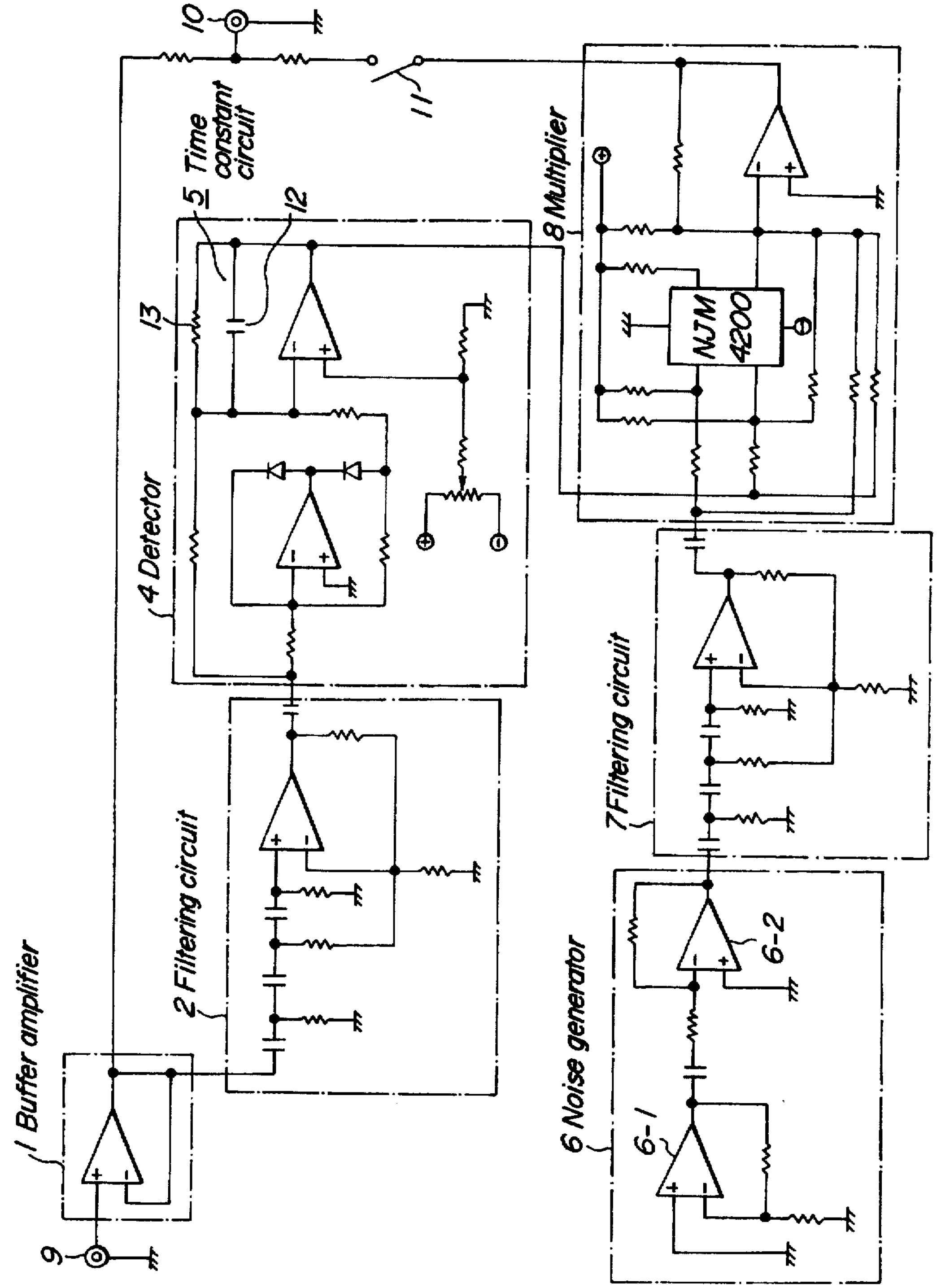
FIG. 4 is a circuit diagram representing a more concrete construction of the apparatus illustrated in FIG. 3.

FIG. 4 is a circuit diagram depicting a concrete construction of the apparatus shown in FIG. 3. In FIG. 4, the same numerical references are given to the elements which function as same as the elements shown in FIG. 3; and the explanation therefore will be omitted.

The circuit shown in FIG. 4 is to be provided after a D/A converting circuit in a digital audio system, or before amplifying steps in an analog audio system.

In FIG. 4, the original audio signal is inputted from the input terminal 9, and amplified by the buffer amplifier 1. A part of the output of the buffer amplifier 1 is directly supplied to the output terminal 10, and the other part of the output is introduced to a high pass filter circuit 2. The cut-off frequency of the high pass filter circuit 2 is about 6 kHz.

The audio signal having a frequency range of 6 to 20 kHz, which is selected by the filter circuit 2, is detected by the detector 4, and then supplied to a multiplying circuit 8 via a time constant circuit 5. The output of the multiplying circuit 8 is used as a level controlling signal for controlling the noise component to be added to the original audio signal.

A time constant of the time constant circuit 5, which is selected at a predetermined value by determining values of the capacity 12 and the register 13, makes the noise component to be added to the original audio signal comfortable to an auditory sense of people, and the quality of the reproduction sound is well improved. According to actual listening of the reproduced sound, it is proved that the sound quality of the reproduced sound becomes excellent around the time constant of 2.2 mS under the condition of C=0.047 μF and R=47 kΩ. The inventor carried out experiments to search a preferable range of the time constant, varying the values of C and R. As a result of the experiments, it is proved the preferred range of the time constant is 2.2 mS plus or minus 40%. In this embodiment, the time constant is obtained by only a single order of the C-R element. However, the construction of the time constant circuit 5 is not limited to this embodiment, and thus the circuit constituted of two-orders or more of C-R elements can be used so far as almost the same delay is generated in the signal. It should be noted that the time delay may be obtained by using other delay circuits.

In a noise generator 6, a thermal noise obtained from inner resistances and feedback resistances of operating amplifiers (TL072) 6-1 and 6-2 are amplified to be used as a signal source of the noise component to be added to the original audio signal. The thus obtained noise component is supplied to a high pass filter circuit 7 through which only a signal having its frequency range exceeding over 20 kHz passes. Since the thermal noise obtained from semiconductors has a tendency where the level decreases in a higher range due to an influence of the gain characteristic of semiconductors, a band pass filter, by which a higher frequency range is also cut off, is not used in this embodiment. It should be noted that not only resistance elements but also other resistances, such as a base resistance in transistors, and a channel resistance in FETs, can be also used as the thermal noise source.

The output of the noise generating circuit 6 is inputted to the multiplying circuit 8 and multiplied with said level control signal in the circuit 8. Therefore, the noise component is added to the original audio signal, being varied in accordance to the variation of the level of the original audio signal.

Further, a switch 11 is provided in a path for mixing the signal to be added and the original audio signal in order to make possible to arbitrarily change that the noise signal is added or not.

The inventor carried out hearing experiments of actual music sounds with the above mentioned circuit, in order to realize the effect of the present invention. By switching the switch 11, the reproduced sound when the random noise component is added to the original audio signal and the reproduced sound to which no random noise component is added are compared. As a result, it is realized by the auditory sense of people that when the noise component is added to the original audio signal the sound quality of the reproduced audio signal becomes so natural.

Figure 5:
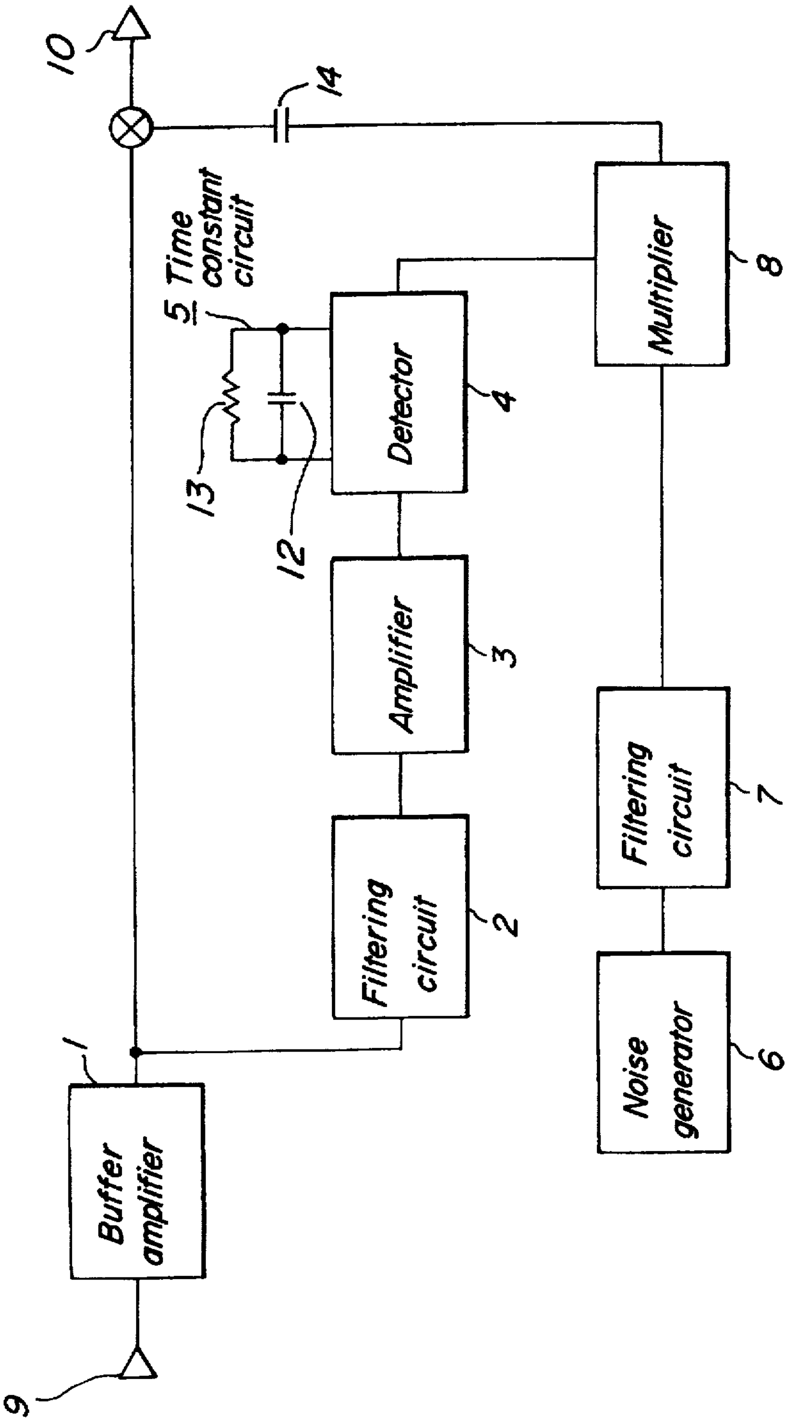
FIG. 5 is a block diagram showing a construction of the second embodiment of the audio signal reproducing apparatus according to the present invention.

FIG. 5 is a block diagram depicting a construction of the second embodiment of the present invention. It should be noted that the same numerical references are applied to the same elements as those of the first embodiment and the explanation therefore is omitted.

In the second embodiment, a capacitor 14 is provided in the circuit for adding the random noise component from the multiplier circuit 8 to the original audio signal. By the capacitor 14, it becomes possible to decrease a load applied to the buffer amplifier 1. According to hearing tests, it is realized that a pressure feeling is decreased in the middle and lower range.

Figure 6:
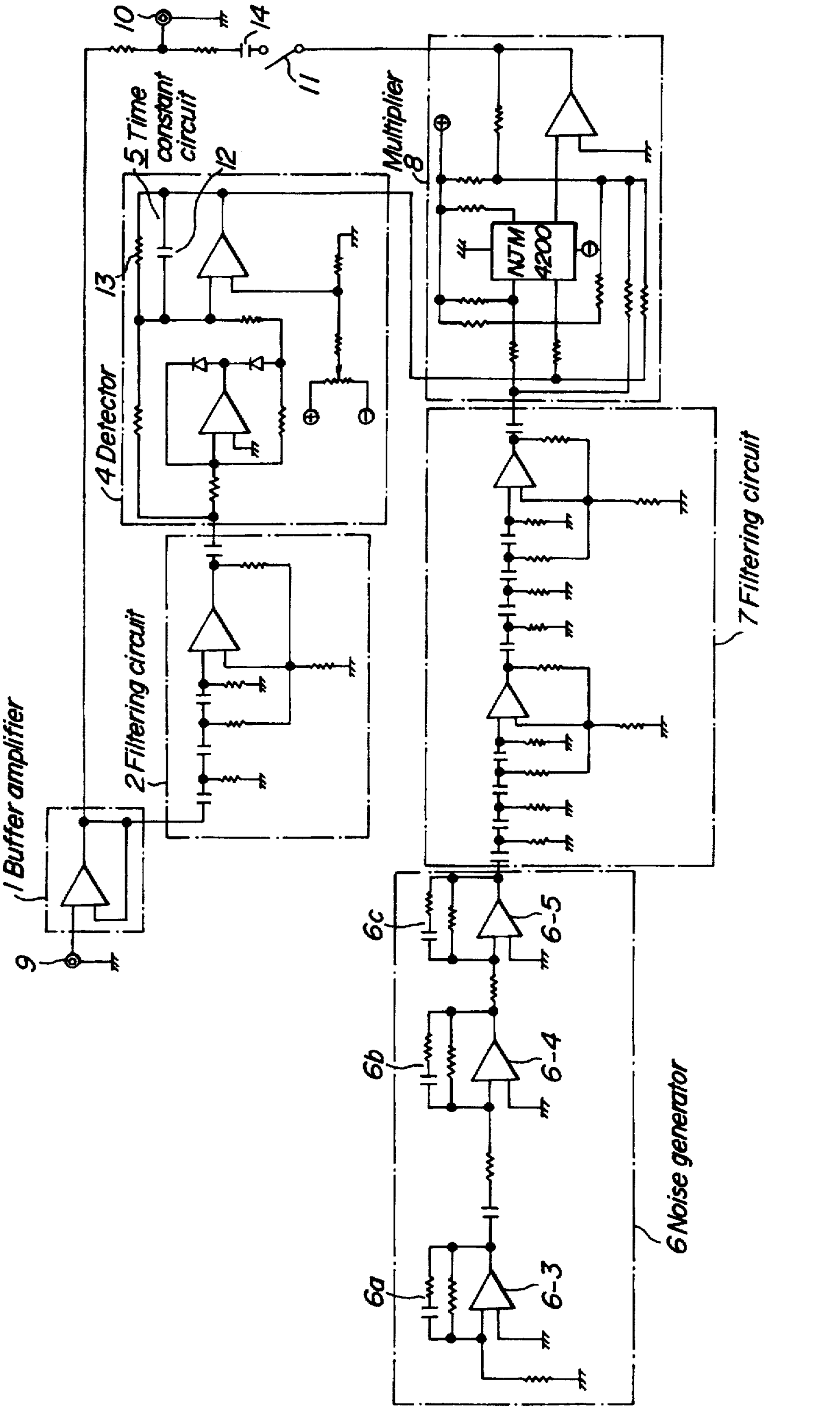
FIG. 6 is a circuit diagram depicting a construction of the third embodiment of the audio signal reproducing apparatus according to the present invention.

FIG. 6 is a circuit diagram illustrating a construction of the third embodiment of the audio signal reproducing apparatus according to the present invention.

In the third embodiment, the operating amplifiers (6-3,6-4,6-5) constituting the random noise generating circuit 6 are arranged to have a three-stage construction, and the noise generated in the random noise generating circuit 6 is processed so as to become a so-called pink noise, which is carried out so that a CR element is attached with the feedback resistance of each operating amplifier in a parallel manner. By adding the pink noise component to the original audio signal in such a manner, the reproduced audio signal becomes mellow and close much more to the sound of natural music.

Further, in the third embodiment shown in FIG. 6, the filtering circuit 7 is constituted of 8th-order filters in order to positively cut off the noise component below 20 kHz. When the order of the filtering circuit 7 is arranged to be high, a much clearer sound quality can be obtained, because the noise component is not added to the original signal in the audible frequency range. The number of order of the filters is not limited to that of this embodiment, but may be modified in accordance with the type of audio equipment to be used. According to hearing tests, it is recognized that as higher the number of order of filters, the more is the quality of the reproduced sound improved.

Figure 7:
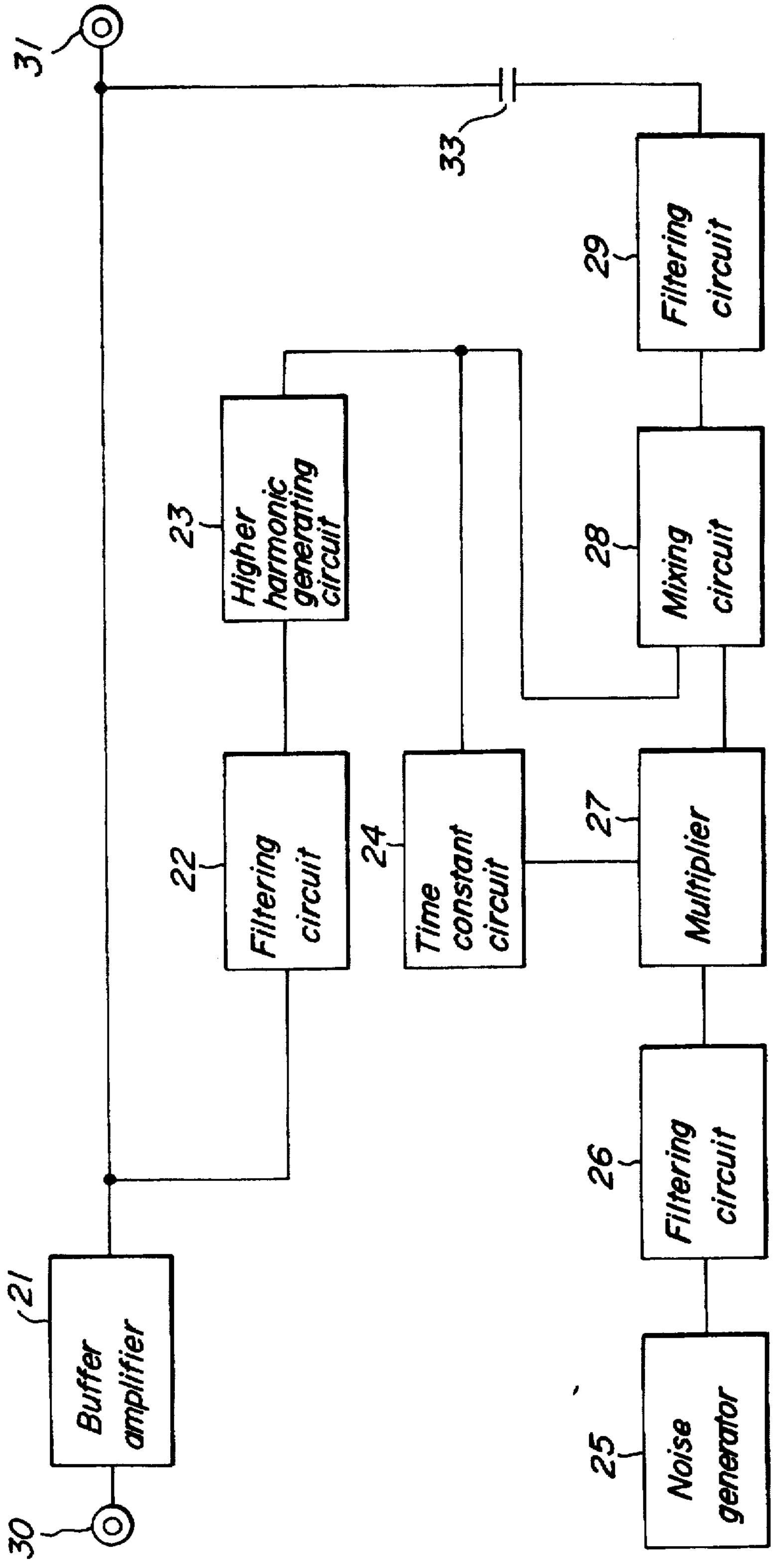
FIG. 7 is a block diagram illustrating a construction of the fourth embodiment of the audio signal reproducing apparatus according to the present invention.

FIG. 7 is a block diagram representing a construction of the fourth embodiment.

In FIG. 7, the apparatus according to the present invention is applied in an output circuit in the analog audio signal reproducing apparatus, or in an output circuit after D/A conversion in the digital audio signal reproducing apparatus. In the fourth embodiment, the original audio signal supplied from an input terminal 30 is sent to a buffer amplifier 21. A part of the signal is directly supplied to an output terminal 31 and the other one is inputted into a band pass filter 22. It should be noted that the high pass filter can be replaced by a band pass filter 22. Only a specific range of the original audio signal passes through the filter 22 and the filtered signal is inputted to a higher harmonics generating circuit 23 to generate higher harmonics of the original audio signal. An output of the higher harmonics generating circuit 23 is inputted to a multiplying circuit 27 via a time constant circuit 24 to obtain the level controlling signal for controlling a level of a noise component to be added to the original audio signal.

On the other hand, the noise component to be added to the original audio signal is obtained from a noise generator 25. The noise generated in the noise generator 25 is filtered by a high pass filter circuit 26 and then inputted to the multiplying circuit 27. It should be noted that the high pass filter circuit 26 may be replaced by a band pass filter circuit. In the multiplying circuit 27, the noise component is multiplied with the noise level controlling signal, varying in accordance with the variation of the level controlling signal. The output of the multiplying circuit 27 and an output of the higher harmonics generating circuit 23 are inputted to a mixing circuit 28; and the output of the circuit 28 is further filtered by a high pass filter 29 in order to remove an influence to an audible frequency range of the noise. In such a manner a signal to be added to the original audio signal is obtained and the added signal is outputted from the output terminal 31 via a capacitor 33.

The frequency range of the signal to be added to the original audio signal has no upper limitation. However, it is enough if the signal covers the range up to about 100 kHz, the same as the first embodiment.

Figure 8:
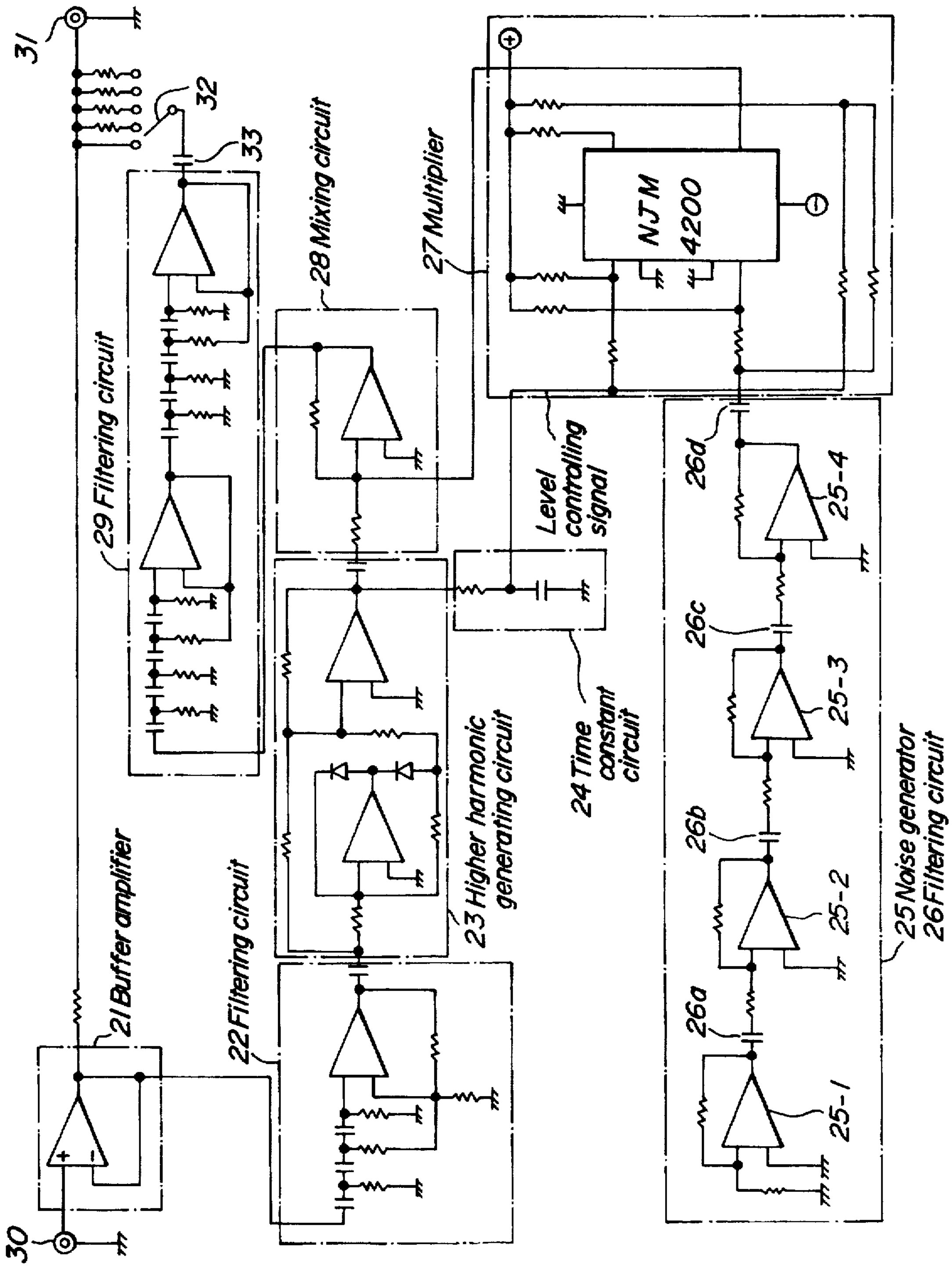
FIG. 8 is a circuit diagram representing a more concrete construction of the apparatus illustrated in FIG. 7.

FIG. 8 is a circuit diagram showing a concrete construction of the apparatus represented in FIG. 7. The same numerical references are applied to the elements which function as those in FIG. 7. As well as the other embodiments, the apparatus shown in FIG. 8 is arranged in rear of the D/A converting circuit in a digital audio system, or in front of amplifying steps in an analog audio system.

The same as in the first embodiment, when the apparatus is used in a stereo system or multi channel system, it is recommended to provide the random noise generating source in each channel.

An original audio signal comes from an input terminal 30 and is then amplified by a buffer amplifier 21. A part of the output of said buffer amplifier 21 is directly supplied to an output terminal 30 and the other part is introduced to a high pass filter circuit 22. A cut-off frequency of the high pass filter 22 is about 6 kHz.

The audio signal in the range of 6 to 20 kHz, which is selected by the filter circuit 22, is inputted to a higher harmonics generating circuit 23 to generate a higher harmonics component of the original audio signal. In the higher harmonics generating circuit 23, a non-linear circuit is arranged as a double side bands rectification, by which a distortion is generated to obtain a higher harmonics component.

A part of the output of the higher harmonics generating circuit 23 is supplied to a multiplying circuit 27 via a time constant circuit 24, which has a predetermined time constant to be used as a level controlling signal for controlling the level of the noise component to be added to the original audio signal. As explained in the first embodiment, it is proved that there is a high co-relation between the time constant of the time constant circuit 24 and the naturalness produced to the auditory sense by the reproduced sound. According to hearing tests, it is confirmed that the preferable time constant, which is suitable to the auditory sense, is in the range of 2.2 mS plus or minus 40%. The other part of the output of the higher harmonics generating circuit 23 is directly supplied to a mixing circuit 28 to be mixed with the output of the multiplier 27, and the thus mixed signal is added to the original audio signal.

In the noise generating circuit 25, the noise component to be added to the original audio signal is obtained by amplifying thermal noises generated in resistance elements of the operating amplifiers 25-1, 25-2, 25-3, 25-4. In this embodiment, the capacitors 26*a* to 26*d*, which connect the amplifiers of the noise generating circuits 25 to each other, constitute of a filtering circuit 26, so that the noise component of 20 kHz or less is cut off from the noise generated in the noise generating circuit 25 by the filters (capacitors) to some degrees. The thermal noise of a semiconductor device has a tendency where the frequency characteristic thereof is decreased in a higher frequency region, being influenced by a gain characteristics of the semiconductor device. Therefore, in this embodiment a band pass filter which cuts off the higher frequency range is not used.

The output of the noise generating circuit 25 is inputted to the multiplying circuit 27 and then multiplied with said level controlling signal. Thereby, the output level of the noise component varies in accordance with the output level of the original audio signal. The thus obtained noise component is inputted to a mixing circuit 28 to be mixed with the higher harmonics component generated in the higher harmonics generating circuit 23, which depends on the original audio signal. Then, the signal mixed with the noise component and the higher harmonics component is added to the original audio signal via a high pass filter 29 through which only the signal component of 20 kHz or more passes.

In the high pass filter 29, a highly-ordered filter, i.e. 8th-ordered filter, is used in order to positively cut off the components of 20 kHz or less from the higher harmonics component and the noise component to be added to the original audio signal. In addition, the noise component is cut off by the filter circuit 26 (4th-ordered). Since the higher component of the mixed signal is further cut off by a capacitor 33, the noise component of 20 kHz or less is finally cut off by a 11th-ordered filter in total. Therefore, almost no noise component in the audible range of the reproduced audio signal is retained, a clear sound quality can be obtained in the reproduced music sound.

In the fourth embodiment, a switch 32 is provided so as to be able to change the amount of the higher harmonics component and the random noise component to be added to the original audio signal at several steps. Therefore, by changing the steps of the switch 32 according to the type of the original sound or the preference of a listener, a preferred sound quality can be obtained. However, the switch 32 is not an essential requirement, and it may be possible to arrange so as to add a predetermined fixed amount of the signal to the original audio signal.

The present inventor carried out experiments of hearing test concerning the above-explained apparatus in order to confirm the effect of the second invention. Comparing the case that the random noise component and the higher harmonics component are added to the original audio signal with the case that no signal component is added, it is recognized that a naturalness in the higher range of the reproduction signal is improved and a very natural audio signal can be reproduced in the former case.

Figure 9:
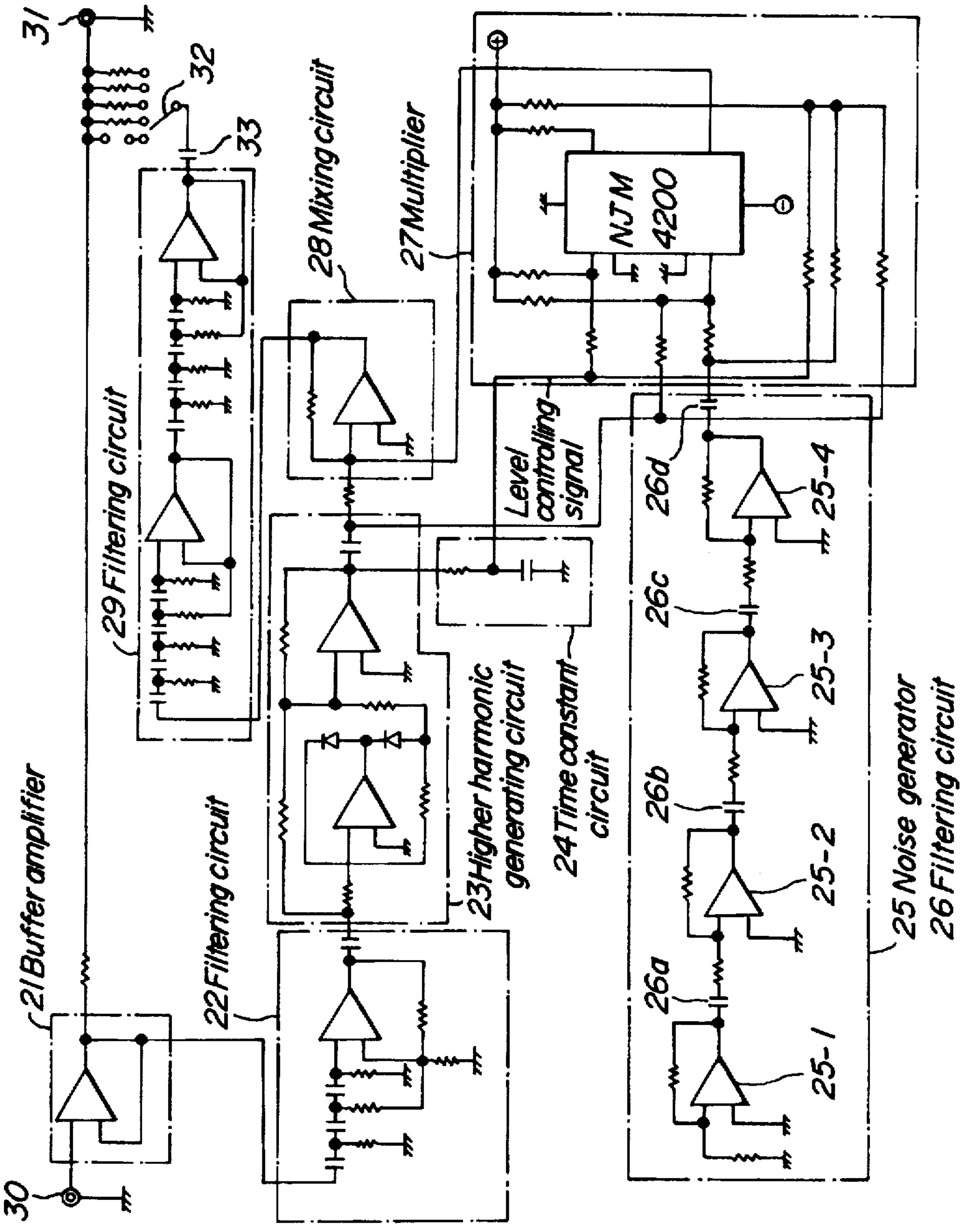
FIG. 9 is a circuit diagram showing a construction of the fifth embodiment of the audio signal reproducing apparatus according to the present invention.

FIG. 9 is a circuit diagram showing a construction of the fifth embodiment of the audio signal reproducing apparatus according to the invention. In the fifth embodiment, a part of the higher harmonics generating circuit 23 is inputted to the multiplying circuit 27 via a fore-step of the noise component inputting step thereof, so that the level of the higher harmonics component to be added to the original audio signal is also controlled by the level controlling signal which comes from the time constant circuit 24. According to such construction, it is possible to obtain a reproduced audio signal much closer to natural sound.

It should be noted that the signal is added to the original audio signal via a capacitor 33 the same as the second embodiment.

Figure 10:
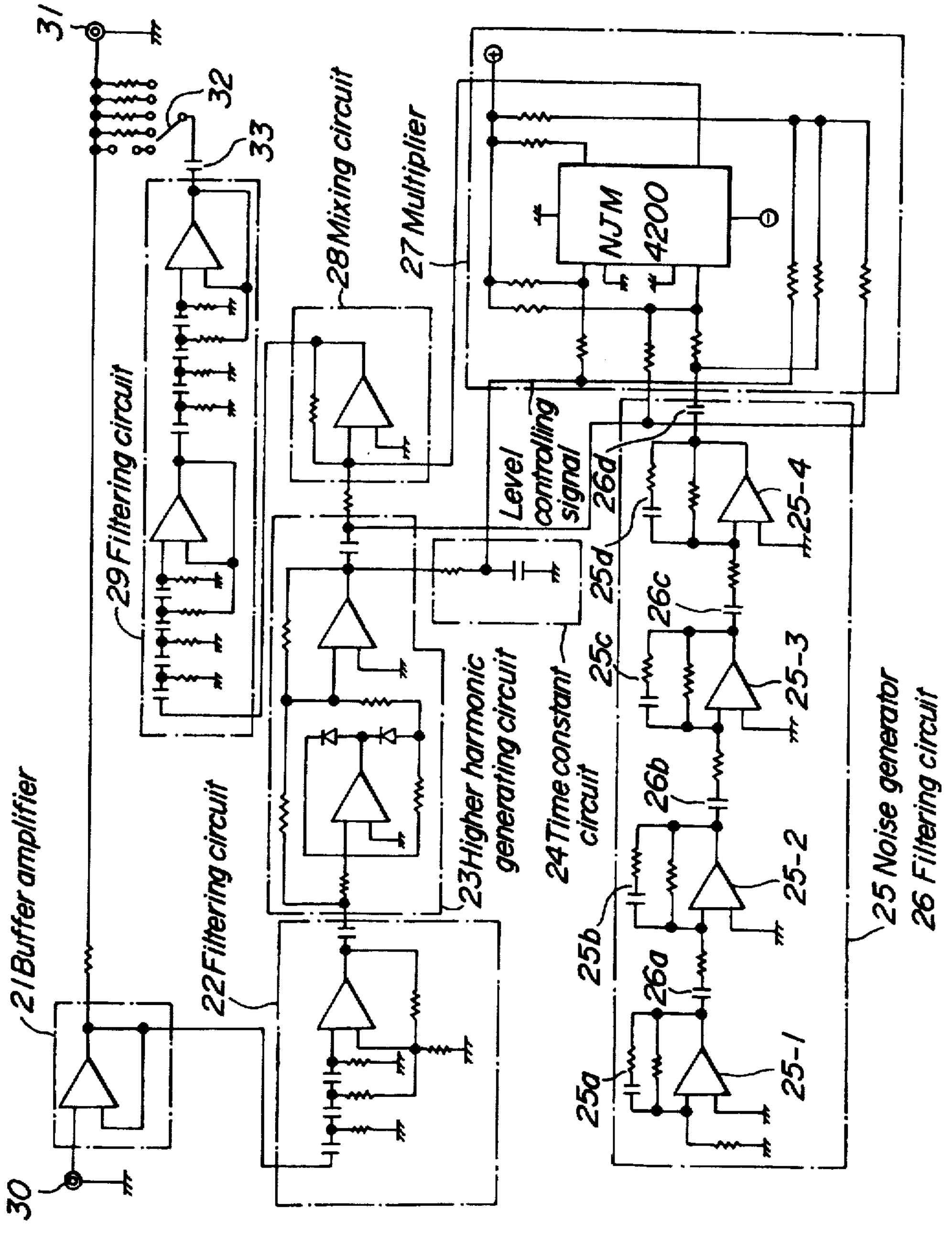
FIG. 10 is a circuit diagram depicting a construction of the sixth embodiment of the audio signal reproducing apparatus according to the present invention.

FIG. 10 is a circuit diagram illustrating a construction of the sixth embodiment of the audio signal reproducing apparatus according to the invention. In the sixth embodiment, capacitor and resistance elements 25*a*–25*d* are attached to the feedback resistances of operating amplifiers in the noise generating circuit 25 in a parallel manner. By such an arrangement, the noise component in a higher range is gradually decreased so as to generate so-called pink noise; and the thus obtained pink noise is added to the original audio signal. As stated in the explanation for the third embodiment, a much more naturally reproduced audio signal can be obtained by adding the pink noise.

Figure 11:
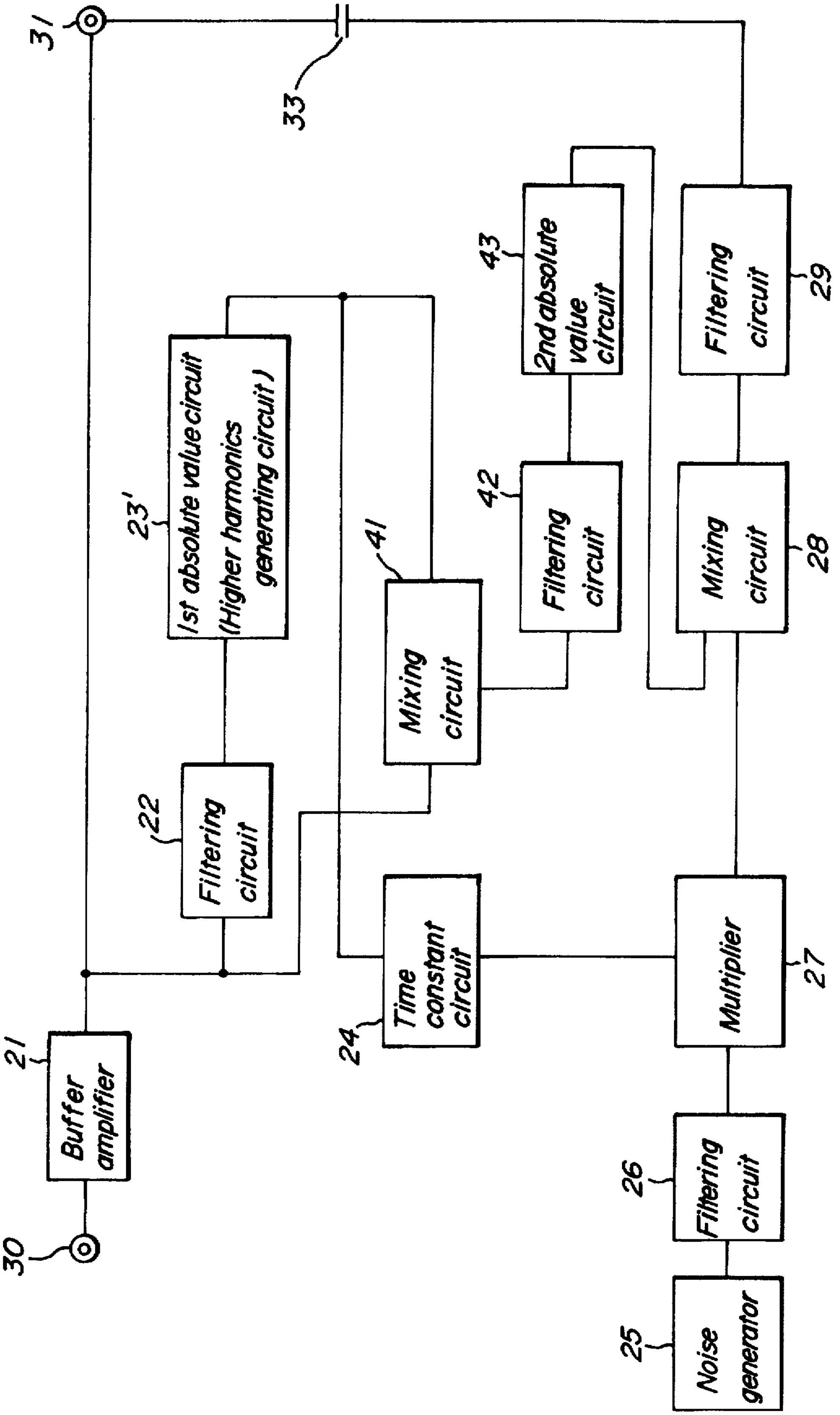
FIG. 11 is a block diagram illustrating a construction of the seventh embodiment of the audio signal reproducing apparatus according to the present invention.

FIG. 11 is a block diagram showing a construction of the seventh embodiment of the present invention. In the seventh embodiment, the non-linear circuit for generating higher harmonics is arranged to be a two-stage construction. That is to say, a part of the original audio signal is supplied to a first absolute value circuit 23' via the filter circuit 22; then an output of the absolute value circuit 23' is supplied to a mixing circuit 41 to be mixed with the original audio signal; and an output of the mixing circuit 41 is further inputted to a second absolute value circuit 43 via a filter circuit 42 to generate a suitable higher harmonics of the original audio signal. The other construction of this embodiment is the same as that of the embodiment shown in FIG. 7, so the explanation therefore is omitted here. By hearing tests, it is recognized that a more naturally reproduced sound becomes much more natural by the two-stage construction of the non-linear circuit for generating the higher harmonics. In this embodiment the non-linear circuit is arranged to have a two-stage construction, but a three-stage or more construction is available. Further, it may be possible to arrange phase sifters and/or delay circuits between the first and second stages of the non-linear circuit in addition to the filtering circuit 42, or it may be also possible to arrange it to mix up the output of each stage of the non-linear circuit. Furthermore, in this embodiment, absolute value circuits are used for the non-linear circuit, but other non-linear circuits, such as a clipping circuit, a square circuit, a square root circuit, and a logarithmic circuit, can also be used.

In the first to seventh embodiments stated above, only the construction of the audio signal reproducing circuit for one channel is shown. However, in a stereo system, which has two channels or in a multi-channel system, such as a surround system, having four or more channels, it is preferred to independently provide the same number of noise generating sources as the number of channels provided in the audio system to be used, in view of the sound expansion and giving a sense of actual participation.

Further, in the above-explained embodiments, the noise component and/or the higher harmonics component is added to the original audio signal in an analog manner. However, the present invention is not limited to these embodiments, but it may also be possible to arrange such that all steps of the signal processing in the system of the present invention are carried out in a digital manner and then picked up an output therefrom after a D/A conversion. However, in this case, it is required to pay some attention that to the construction of the circuits for processing the signal becomes complex and the noise generated when the signal is changed to digital signal is conspicuous.

Rather, it can be said that in the present invention the noise which is generated in an analog manner works as like as Dither method, so that the non-linearity or the regular noise generated when the signal is changed to digital signals becomes not to be conspicuous.

Furthermore, in the embodiments stated above, the time constant circuit is used in order to generate a time delay in the level controlling signal for controlling the random noise component and/or the higher harmonics component. However, another means, e.g. a delay circuit, can alternatively be used, providing almost the same time delay in the level controlling signal.

Moreover, it may be possible to arrange such that the signal components to be added to the original audio signal are generated in accordance with the method and apparatus according to the present invention, and then the thus obtained signal is amplified by an exclusive amplifier, then subjected to an electron-audio conversion with the aid of exclusive speakers, which are provided independently from the electro-audio conversion means for the original audio signal, and then the sound converted from the adding signal is synthesized with the sound converted from the original audio signal in a space. If the level of the signal component to be added is controlled in accordance with the level of the original audio signal before the signal component is synthesized with the original audio signal, the same effect can be obtained as the above mentioned embodiments, where the signal component is mixed with the original audio signal before the electro-audio conversion, can be obtained.

Moreover, the apparatus according to the present invention can be preferably utilized not only in the audio signal reproducing apparatuses, such as a record player and a CD player, but also in electronic music instruments. In addition, it is also possible to utilize the present invention to manufacture a new valuable music software on which sound signals are recorded with much more improved sound quality. The software may be manufactured in such a manner of: reproducing signals recorded on the conventional master tape, in which a frequency component in the higher range is cut off, adding the signal obtained by the method according to the present invention to the reproduced signal; and then reproducing the thus added signal on a music tape or disk having a higher recording ability.

As stated above, according to the present invention, it is possible to overcome the unnaturalness to the auditory sense caused by a decrease or a lack of signal higher than the audible frequency region in the analog audio system or than the reproducible frequency range in the digital audio system determined by the sampling frequency thereof. According to the present invention, the decrease or the lack of the audio spectrum component is compensated for by adding the noise component obtained from the random noise signal source(s) to the original audio signals under a given condition. Therefore, a very natural reproduction sound quality can be obtained.

In addition, since the noise component higher than the audible frequency range is added to the original audio signal, the decreased reproduction frequency characteristic or the lacked frequency spectrum can be compensated for without providing a complex circuit construction, but the effect of the improvement is great.

Furthermore, according to the second aspect of the invention, since the higher harmonics component exceeding over the audible frequency range or the upper limit of the reproducible range is added to the original audio signal in addition to the noise component, the unnaturalness to people's auditory senses disappears and the quality of the reproduced sound can be improved greatly.

What is claimed is:

1. An audio signal reproducing method wherein an audio signal is reproduced in such a manner that an output having a frequency spectrum in a range exceeding over an upper limit of a reproducible frequency range exceeding over an upper limit of an audible frequency range is added to an original audio signal, the method comprising the following steps:

picking up a random noise component from a signal source provided separated from a signal supply of said original audio signal;

selecting a selected noise component having a spectrum in a predetermined frequency range from said random noise component;

adding said selected noise component to said original audio signal; and reproducing a signal in which said selected noise component and said original audio signal are mixed together.

2. An audio signal reproducing method according to claim 1, further comprising the following steps:

picking up a level controlling signal having a spectrum in a predetermined frequency range from said original audio signal; and controlling a level of said selected noise component added to said original audio signal in accordance with a variation of a level of said level controlling signal.

3. An audio signal reproducing method according to claim 2, further comprising the following steps:

generating a time delay in said level controlling signal; and controlling the level of said selected noise component added to said original audio signal in accordance with the level controlling signal having said time delay.

4. An audio signal reproducing method according to claim 1, wherein:

said selected noise component added to said original audio signal is obtained from a thermal noise.

5. An audio signal reproducing method according to claim 1, wherein:

said selected noise component added to said original audio signal has a characteristic similar to pink noise.

6. An audio signal reproducing method wherein an audio signal is reproduced in such a manner that an output having a frequency spectrum in a range exceeding over an upper limit of a reproducible frequency range or exceeding over an upper limit of an audible frequency range is added to an original audio signal, the method comprising the following steps:

picking up a higher harmonics component from said original audio signal and a random noise component from a signal source provided separated from said original audio signal; and selecting a selected noise component having a spectrum in a predetermined frequency range from said random noise component;

adding said higher harmonics component picked up from said original audio signal and said selected noise component to said original audio signal; and reproducing a signal in which said selected noise component and said higher harmonics component are mixed with said original audio signal.

7. An audio signal reproducing method according to claim 6, further comprising the following steps:

picking up a level controlling signal from said original audio signal; and controlling a level of said higher harmonics component and/or a level of said selected noise component added to said original audio signal in accordance with a variation of a level of said level controlling signal.

8. An audio signal reproducing method according to claim 7, further comprising the following steps:

generating a time delay in said level controlling signal; and controlling said level of said higher harmonics component and/or a level of said selected noise component added to said original audio signal in accordance with the level controlling signal having said time delay.

9. An audio signal reproducing method according to claim 6, wherein:

said selected noise component added to said original audio signal is obtained from a thermal noise.

10. An audio signal reproducing method according to claim 6, wherein:

said selected noise component added to said original audio signal has a characteristic similar to pink noise.

11. An audio signal reproducing apparatus wherein an audio signal is reproduced in such a manner that an output having a frequency spectrum in a range exceeding over an upper limit of a reproducible frequency range or exceeding over an upper limit of an audible frequency range is added to an original audio signal, the apparatus comprising:

random noise generating means for generating a random noise to be added to said original audio signal, said random noise generating means being separated from a signal supply of said original audio signal;

level controlling means for controlling a level of said random noise to be added to said original audio signal in accordance with a variation of a level of said original audio signal;

frequency range selecting means for selecting a frequency range exceeding over an upper limit of an audible frequency range or a reproducible frequency range from said random noise generated by the random noise generating means; and signal adding means for adding the random noise whose output level is controlled by said level controlling means and whose frequency range is selected by said frequency range selecting means to said original audio signal.

12. An audio signal reproducing apparatus according to claim 11, wherein:

said level controlling means comprises a level control signal generating means for generating a level control signal for controlling an amount of said random noise to be added to said original audio signal, and a time delay generating means for giving a time delay to said level control signal generated by said level control signal generating means; and wherein the level of said random noise to be added to said original audio signal is controlled in accordance with a variation of said level control signal having said time delay.

13. An audio signal reproducing apparatus according to claim 12, wherein:

said time delay generating means comprises a time constant circuit having its time constant in a range of 2.2 mS plus or minus 40%.

14. An audio signal reproducing apparatus according to claim 13, wherein:

said frequency range selecting means comprises highly-ordered filters.

15. An audio signal reproducing apparatus according to claim 14, wherein:

said signal adding means comprises a capacitor, and whereby said random noise is added to said original audio signal via said capacitor.

16. An audio signal reproducing apparatus according to claim 11, wherein:

at least said random noise generating means is provided in each channel of an audio signal reproducing system to be used in an independent manner.

17. An audio signal reproducing apparatus wherein an audio signal is reproduced in such a manner that an output having a frequency spectrum in a range exceeding over an upper limit of a reproducible frequency range or exceeding over an upper limit of an audible frequency range is added to an original audio signal, the apparatus comprising:

random noise generating means for generating a random noise to be added to said original audio signal, said random noise generating means being separated from a signal supply of said original audio signal;

higher harmonics component generating means for generating a higher harmonics component of said original audio signal;

level controlling means for controlling a level of said random noise to be added to said or signal audio signal in accordance with a level of said original audio signal;

frequency range selecting means for selecting a signal component having a frequency range exceeding over an audible frequency range or an upper limit of a reproducible frequency range from said random noise and said higher harmonics component; and signal adding means for adding the random noise whose output level is controlled by said level controlling means and whose frequency range is selected by said frequency range selecting means, and for adding the higher harmonics component having a frequency range selected by said frequency range selecting means to said original audio signal.

18. An audio signal reproducing apparatus according to claim 17, wherein:

said level controlling means comprises a level control signal generating means for generating a level control signal for controlling an amount of said random noise to be added to said original audio signal by picking up a part of said original audio signal, and a time delay generating means for giving a time delay to the level control signal generated by said level control signal generating means; and wherein the level of said random noise and/or said higher harmonics component to be added to said original audio signal is controlled in accordance with a variation of said level control signal having said time delay.

19. An audio signal reproducing apparatus according to claim 18, wherein:

said time delay generating means comprises a time constant circuit having its time constant in a range of 2.2 mS plus or minus 40%.

20. An audio signal reproducing apparatus according to claim 19, wherein:

said frequency range selecting means comprises highly-ordered filters.

21. An audio signal reproducing apparatus according to claim 20, wherein:

said signal adding means comprises a capacitor, and whereby said random noise and said higher harmonics component are added to said original audio signal via said capacitor.

22. An audio signal reproducing apparatus according to claim 17, wherein:

at least said random noise generating means is provided in each channel of an audio signal reproducing system to be used in an independent manner.

23. An audio signal reproducing apparatus wherein an audio signal is reproduced in such a manner that an output having a frequency spectrum in a range exceeding over an upper limit of a reproducible frequency range or exceeding over an upper limit of an audible frequency range is added to an original audio signal, the apparatus comprising:

random noise generating means for generating a random noise to be added to said original audio signal, said random noise generating means being separated from said original audio signal;

higher harmonics component generating means for generating a higher harmonics component of said original audio signal;

level controlling means for controlling levels of said random noise and said higher harmonics component to be added to said original audio signal in accordance with a level of said original audio signal;

frequency range selecting means for selecting a frequency range exceeding over an audible frequency range or an upper limit of a reproducible frequency range from said random noise and said higher harmonics component; and signal adding means for adding said random noise and said higher harmonics component, whose output levels are controlled by said level controlling means and whose frequency ranges are selected by said frequency range selecting means, to said original audio signal.

24. An audio signal reproducing apparatus according to claim 17, wherein said higher harmonics component generating means comprises a non-linear circuit.

25. An audio signal reproducing apparatus according to claim 24, wherein said non-linear circuit comprises multi-stages.

26. An audio signal reproducing apparatus according to claim 25, wherein a filtering means is provided between the stages of the non-linear circuit.

* * * * *